United States Patent
Okabe

(10) Patent No.: US 10,911,008 B2
(45) Date of Patent: Feb. 2, 2021

(54) POWER AMPLIFIER MODULE

(71) Applicant: Murata Manufacturing Co., Ltd., Kyoto (JP)

(72) Inventor: Hiroshi Okabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/418,117

(22) Filed: May 21, 2019

(65) Prior Publication Data

US 2019/0273476 A1  Sep. 5, 2019

Related U.S. Application Data

(63) Continuation of application No. 15/944,138, filed on Apr. 3, 2018, now Pat. No. 10,340,863.

(30) Foreign Application Priority Data

Apr. 5, 2017  (JP) ................... 2017-075550

(51) Int. Cl.
| | |
|---|---|
| *H03F 3/14* | (2006.01) |
| *H03F 3/213* | (2006.01) |
| *H03F 3/72* | (2006.01) |
| *H03F 3/195* | (2006.01) |
| *H03F 3/68* | (2006.01) |

(Continued)

(52) U.S. Cl.
CPC ............... *H03F 3/213* (2013.01); *H03F 1/56* (2013.01); *H03F 3/195* (2013.01); *H03F 3/245* (2013.01); *H03F 3/68* (2013.01); *H03F 3/72* (2013.01); *H03F 3/14* (2013.01); *H03F 3/19* (2013.01); *H03F 3/191* (2013.01);

(Continued)

(58) Field of Classification Search
CPC . H03F 3/213; H03F 3/245; H03F 1/56; H03F 3/68; H03F 3/195; H03F 3/72; H03F 2203/7209; H03F 2200/451; H03F 2200/111; H03F 3/191; H03F 1/565;

(Continued)

(56) References Cited

U.S. PATENT DOCUMENTS

| | | | |
|---|---|---|---|
| 5,774,017 A | 6/1998 | Adar | |
| 6,313,698 B1 * | 11/2001 | Zhang | ................... H03F 1/0261 330/133 |

(Continued)

FOREIGN PATENT DOCUMENTS

| | | |
|---|---|---|
| JP | 2007-234738 A | 9/2007 |
| JP | 2008-235759 A | 10/2008 |

(Continued)

*Primary Examiner* — Khanh V Nguyen

(74) *Attorney, Agent, or Firm* — Pearne & Gordon LLP

(57) ABSTRACT

A power amplifier module includes an output-stage amplifier, a driver-stage amplifier, an input switch, an output switch, an input matching circuit, an inter-stage matching circuit, an output matching circuit, and a control circuit. The input switch selectively connects one of a plurality of input signal paths to an input terminal of the driver-stage amplifier. The output switch selectively connects one of a plurality of output signal paths to an output terminal of the output-stage amplifier. The control circuit controls operations of the driver-stage amplifier and the output-stage amplifier. The input switch, the output switch, and the control circuit are integrated into an IC chip. The control circuit is disposed between the input switch and the output switch.

11 Claims, 11 Drawing Sheets

(51) Int. Cl.
  *H03F 1/56* (2006.01)
  *H03F 3/24* (2006.01)
  *H03F 3/191* (2006.01)
  *H03F 3/19* (2006.01)

(52) U.S. Cl.
  CPC .. *H03F 2200/111* (2013.01); *H03F 2200/451* (2013.01); *H03F 2203/7209* (2013.01)

(58) Field of Classification Search
  CPC ........... H03F 1/0277; H01L 2924/3011; H01L 23/66; H03G 1/0088
  USPC .......................................... 330/51, 302, 307
  See application file for complete search history.

(56) References Cited

U.S. PATENT DOCUMENTS

| | | | |
|---|---|---|---|
| 6,414,570 B1 * | 7/2002 | Dalconzo | H01P 1/20363 333/202 |
| 7,538,609 B2 * | 5/2009 | Itkin | H03F 1/0277 330/124 R |
| 7,642,859 B2 | 1/2010 | Shimada | |
| 8,666,338 B2 | 3/2014 | Zhao | |
| 8,710,927 B2 * | 4/2014 | Kamitani | H03F 1/0277 330/124 R |
| 9,647,775 B1 | 5/2017 | Tsutsui | |
| 2007/0210866 A1 | 9/2007 | Sato | |
| 2010/0109052 A1 | 5/2010 | Nakajima | |
| 2011/0021245 A1 | 1/2011 | Taniuchi | |
| 2013/0249626 A1 * | 9/2013 | Matsunaga | H03F 1/0277 330/51 |

FOREIGN PATENT DOCUMENTS

| | | |
|---|---|---|
| JP | 2010-267944 A | 11/2010 |
| JP | 2010-272749 A | 12/2010 |
| JP | 2011-030001 A | 2/2011 |
| JP | 2014-207252 A | 10/2014 |

* cited by examiner

POWER AMPLIFIER MODULE

This a continuation of U.S. Ser. No. 15/944,138 filed on Apr. 3, 2018, which claims priority from Japanese Patent Application No. 2017-075550 filed on Apr. 5, 2017. The content of these applications are incorporated herein by reference in its entirety.

BACKGROUND

The present disclosure relates to a power amplifier module. In accordance with high-density mounting of components in mobile communication terminals, such as cellular phones, various components, such as an antenna switch, an input switch, an output switch, a duplexer, a power amplifier, a low-noise amplifier, and a matching circuit, are more likely to be surface-mounted on the same wiring substrate. Japanese Unexamined Patent Application Publication No. 2014-207252 discloses a power amplifier module including a power amplifier, a control circuit, and an output switch mounted therein. The control circuit controls the operation of the power amplifier. The output switch selectively connects one of plural output signal paths to the output terminal of the power amplifier.

BRIEF SUMMARY

In an example of the power amplifier module of the related art, however, various individual components mounted on a wiring substrate are separately connected to the wiring substrate, thereby making wiring connection complicated. Additionally, high-density mounting of various components on the wiring substrate may cause electromagnetic coupling between the components, which makes it difficult to secure isolation between an input signal and an output signal.

In view of this background, the present disclosure eliminates the need to perform wiring connecting operation separately for individual components and also secures a sufficient level of isolation between an input signal and an output signal.

According to embodiments of the present disclosure, there is provided a power amplifier module including an output-stage amplifier, a driver-stage amplifier, an input switch, an output switch, an input matching circuit, an inter-stage matching circuit, an output matching circuit, and a control circuit. The driver-stage amplifier is connected to an input side of the output-stage amplifier. The input switch selectively connects one of a plurality of input signal paths to an input terminal of the driver-stage amplifier. The output switch selectively connects one of a plurality of output signal paths to an output terminal of the output-stage amplifier. The input matching circuit connects the input switch and the driver-stage amplifier. The inter-stage matching circuit connects the driver-stage amplifier and the output-stage amplifier. The output matching circuit connects the output-stage amplifier and the output switch. The control circuit controls operations of the driver-stage amplifier and the output-stage amplifier. The input switch, the output switch, and the control circuit are integrated into an integrated circuit (IC) chip. The control circuit is disposed between the input switch and the output switch.

According to embodiments of the present disclosure, it is possible to eliminate the need to perform wiring connecting operation separately for individual components and also to secure a sufficient level of isolation between an input signal and an output signal.

Other features, elements, characteristics and advantages of the present disclosure will become more apparent from the following detailed description of embodiments of the present disclosure with reference to the attached drawings.

DETAILED DESCRIPTION

Figure 1:
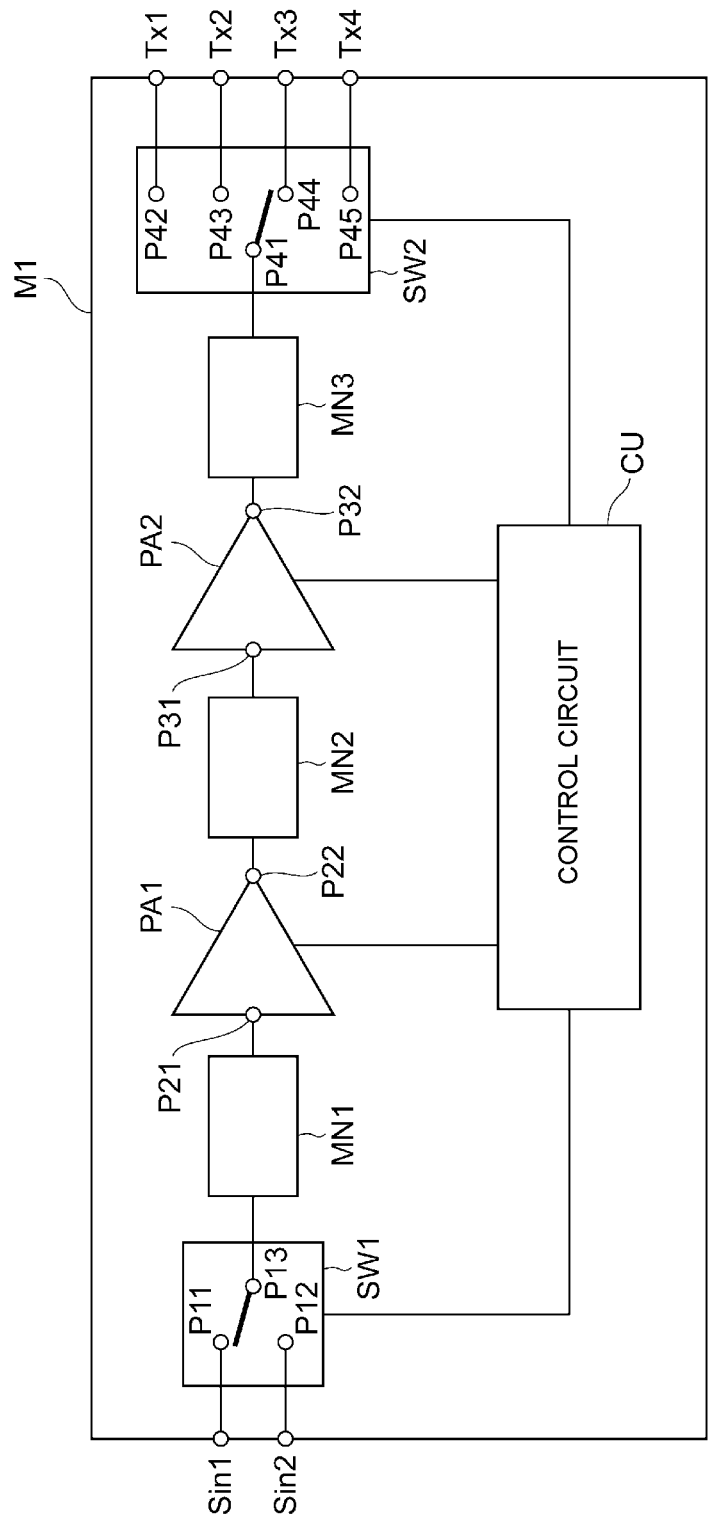
FIG. 1 illustrates the configuration of a power amplifier module according to a first embodiment.

Embodiments of the disclosure will be described below with reference to the accompanying drawings. The same element or the same member in different embodiments is designated by like reference numeral, and the same explanation thereof will not be repeated.

FIG. 1 illustrates the configuration of a power amplifier module M1 according to a first embodiment. The power amplifier module M1 is a radio-frequency (RF) module used in a mobile communication terminal, such as a cellular phone, and amplifies power of an input signal to a level high enough to be transmitted to a base station. The input signal is an RF signal modulated by a radio frequency integrated circuit (RFIC), for example, according to a predetermined communication method.

The power amplifier module M1 includes a driver-stage amplifier PA1, an output-stage amplifier PA2, an input switch SW1, an output switch SW2, an input matching circuit MN1, an inter-stage matching circuit MN2, an output matching circuit MN3, and a control circuit CU. The driver-stage amplifier PA1 is connected to the input side of the output-stage amplifier PA2. The input switch SW1 includes plural input terminals P11 and P12 and an output terminal P13. The input switch SW1 selectively establishes a signal path between one of the plural input terminals P11 and P12 and the output terminal P13. The input terminals P11 and P12 are respectively connected to input signal paths Sin1 and Sin2. The output terminal P13 is connected to an input terminal P21 of the driver-stage amplifier PA1. The input switch SW1 selectively connects one of the input signal paths Sin1 and Sin2 to the input terminal P21 of the driver-stage amplifier PA1. The driver-stage amplifier PA1 amplifies an RF signal input from the input terminal P21 and outputs the amplified RF signal from an output terminal P22. The RF signal is then input into an input terminal P31 of the output-stage amplifier PA2. The output-stage amplifier PA2 then amplifies the RF signal input from the input terminal P31 and outputs the amplified RF signal from an output terminal P32.

The output switch SW2 includes an input terminal P41 and plural output terminals P42, P43, P44, and P45. The output switch SW2 selectively establishes a signal path between the input terminal P41 and one of the plural output terminals P42, P43, P44, and P45. The input terminal P41 is connected to the output terminal P32 of the output-stage amplifier PA2. The output terminals P42, P43, P44, and P45 are respectively connected to output signal paths Tx1, Tx2, Tx3, and Tx4. The output switch SW2 selectively connects one of the plural output signal paths Tx1, Tx2, Tx3, and Tx4 to the output terminal P32 of the output-stage amplifier PA2. In this manner, the RF signal input into the power amplifier module M1 via one of the plural input signal paths Sin1 and Sin2 is amplified and is then output from one of the plural output signal paths Tx1, Tx2, Tx3, and Tx4.

The input matching circuit MN1 connects the input switch SW1 and the driver-stage amplifier PA1 so as to perform impedance matching therebetween. The inter-stage matching circuit MN2 connects the driver-stage amplifier PA1 and the output-stage amplifier PA2 so as to perform impedance matching therebetween. The output matching circuit MN3 connects the output-stage amplifier PA2 and the output switch SW2 so as to perform impedance matching therebetween. The control circuit CU controls the operations of the input switch SW1, the output switch SW2, the driver-stage amplifier PA1, and the output-stage amplifier PA2. For example, the control circuit CU controls the bias points of the driver-stage amplifier PA1 and the output-stage amplifier PA2 and controls the switching operations of the input switch SW1 and the output switch SW2.

FIG. 1 merely illustrates the relationships concerning the connecting state among the components forming the power amplifier module M1. However, FIG. 1 does not illustrate the positional relationships among the components according to the actual layout. For the sake of representation, two stages of amplifiers are shown, but three or more stages of amplifiers may be connected to each other.

Figure 2:
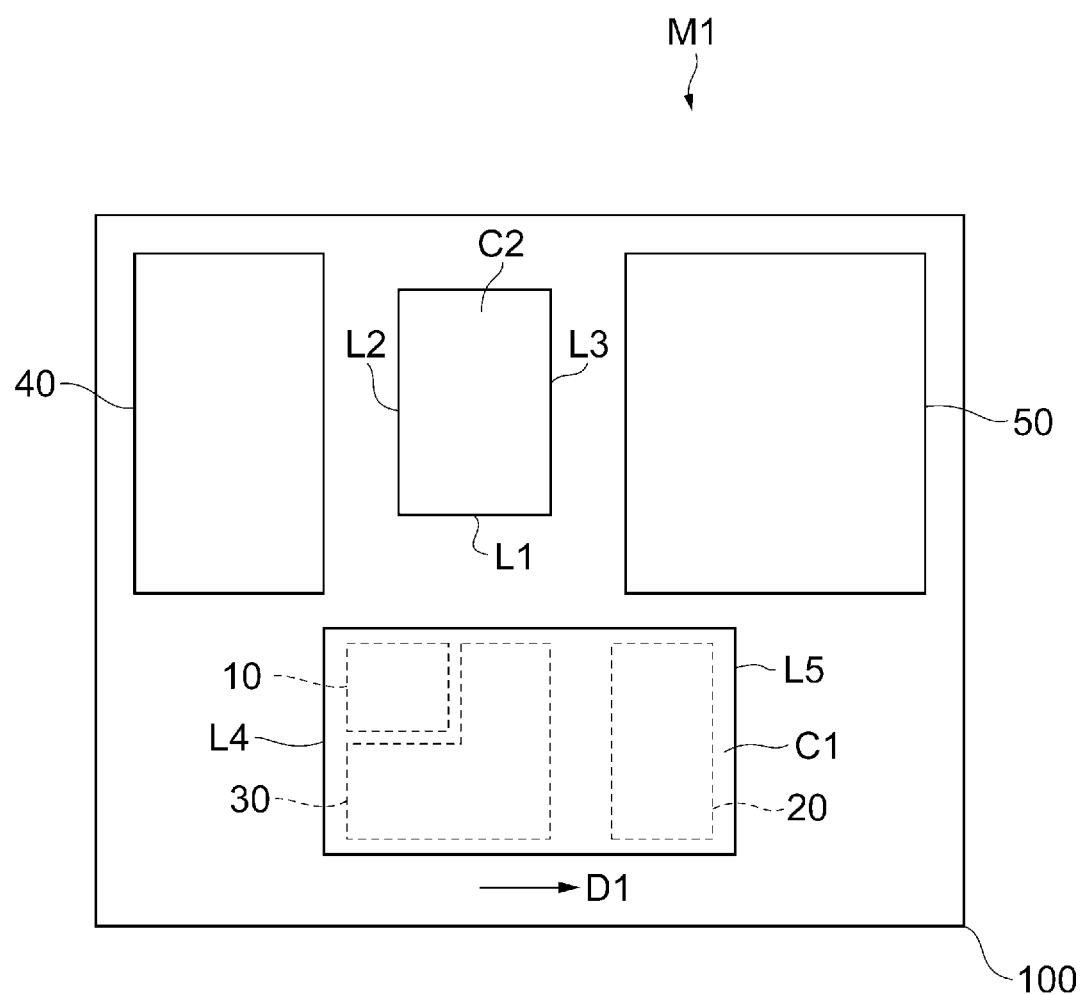
FIG. 2 illustrates the layout of individual components forming the power amplifier module according to the first embodiment.

FIG. 2 illustrates the layout of the individual components forming the power amplifier module M1. The components are disposed on a substrate 100. The substrate 100 is also called a wiring substrate or a mounting substrate. The input switch SW1, the output switch SW2, and the control circuit CU are integrated into a single integrated circuit (IC) chip C1. The input switch SW1 is disposed in a region 10, the output switch SW2 is disposed in a region 20, and the control circuit CU is disposed in a region 30. The control circuit CU is disposed between the input switch SW1 and the output switch SW2. The driver-stage amplifier PA1 and the output-stage amplifier PA2 are integrated into a single IC chip C2. The input matching circuit MN1 and the inter-stage matching circuit MN2 are disposed in a region 40. The output matching circuit MN3 is disposed in a region 50. The IC chips C1 and C2 are formed in a shape having four sides (quadrilateral, such as a substantially rectangle or square), as viewed from a direction substantially perpendicular to the mounting surface of the substrate 100. For the sake of representation, the wiring for connecting each of the IC chips C1 and C2, the input matching circuit MN1, the inter-stage matching circuit MN2, and the output matching circuit MN3 is not shown.

The IC chip C2 is disposed between the input matching circuit MN1 and the inter-stage matching circuit MN2 (region 40) and the output matching circuit MN3 (region 50). For the sake of description, the direction in which the input switch SW1 (region 10), the control circuit CU (region 30), and the output switch SW2 (region 20) are arranged will be called an arrangement direction D1. Among the four sides of the IC chip C2, the side substantially parallel with the arrangement direction D1 and positioned most closely to the IC chip C1 will be called a side L1. Among the four sides of the IC chip C2, the side positioned most closely to the input matching circuit MN1 and the inter-stage matching circuit MN2 (region 40) will be called a side L2. Among the four sides of the IC chip C2, the side positioned most closely to the output matching circuit MN3 (region 50) will be called a side L3. The sides L2 and L3 oppose each other with the side L1 interposed therebetween. That is, the arrangement direction of the input matching circuit MN1 and the inter-stage matching circuit MN2 (region 40), the IC chip C2, and the output matching circuit MN3 (region 50) is parallel with the arrangement direction D1. Among the four sides of the IC chip C1, the side substantially perpendicular to the arrangement direction D1 and positioned most closely to the input switch SW1 (region 10) will be called a side L4. Among the four sides of the IC chip C1, the side substantially perpendicular to the arrangement direction D1 and positioned most closely to the output switch SW2 (region 20) will be called a side L5. The sides L2 and L4 are disposed on the same side (the left side in FIG. 2) of the power amplifier module M1. The sides L3 and L5 are disposed on the same side (the right side in FIG. 2) of the power amplifier module M1.

Figure 3:
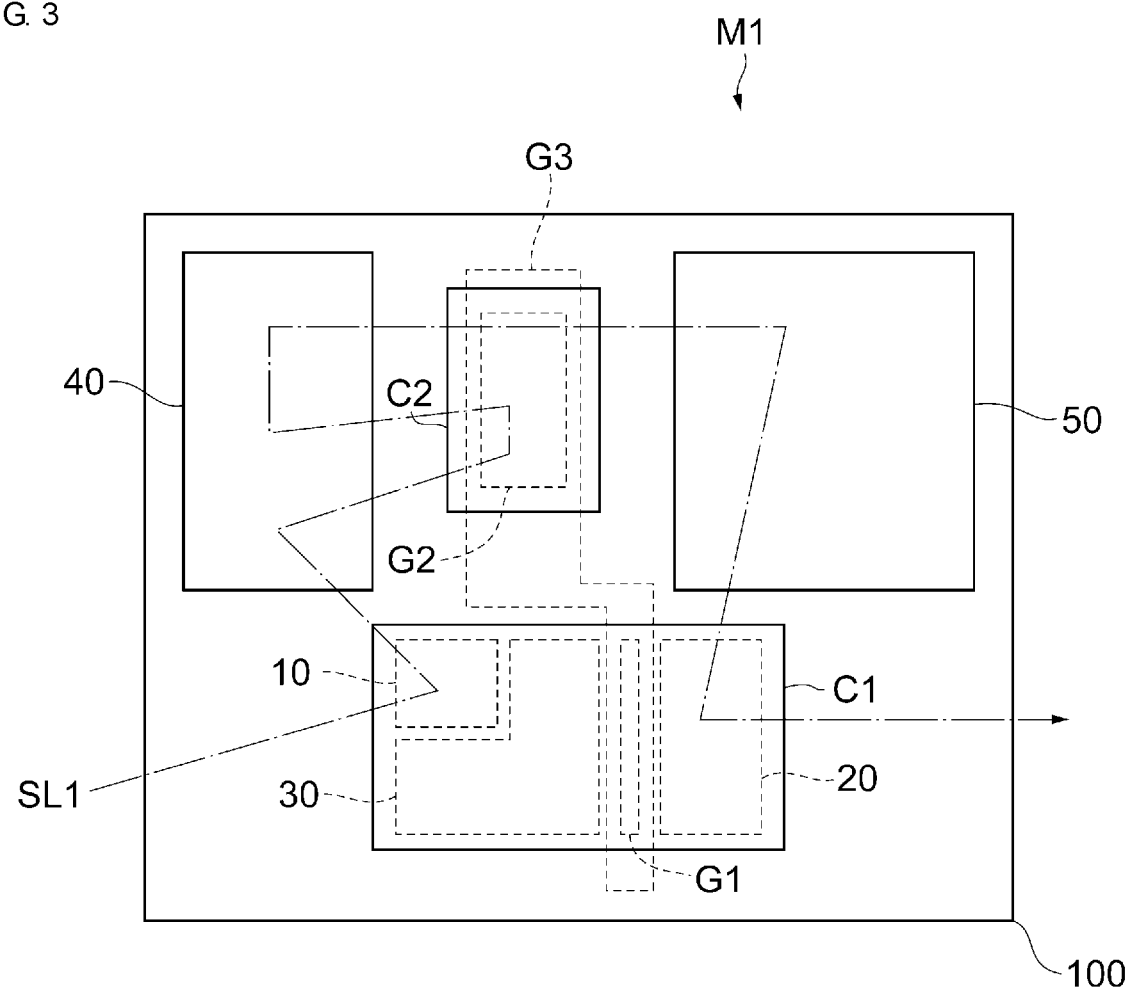
FIG. 3 illustrates the positional relationship of ground surfaces and a ground layer to the other components of the power amplifier module according to the first embodiment.

FIG. 3 illustrates the positional relationship of ground surfaces and a ground layer to the other components of the power amplifier module M1. A ground surface G1 is formed between the input switch SW1 (region 10) and the output switch SW2 (region 20) on one of the two main surfaces of the IC chip C2. More specifically, the ground surface G1 is formed on the main surface (back surface, for example) of the IC chip C1 which is in contact with the substrate 100. A ground surface G2 is formed on one of the two main surfaces of the IC chip C1. More specifically, the ground surface G2 is formed on the main surface (back surface, for example) of the IC chip C2 which is in contact with the substrate 100. A ground layer G3 is buried in the substrate 100. The ground surfaces G1 and G2 are electrically connected to the ground layer G3 through a via-hole (not shown).

In the power amplifier module M1 according to the first embodiment, the input switch SW1 (region 10), the output switch SW2 (region 20), and the control circuit CU (region 30) are integrated into the single IC chip C1, thereby eliminating the need to connect these components by using wires or wiring provided on the substrate 100. Hence, fewer components can be mounted on the substrate 100, thereby reducing the size and the cost of the power amplifier module M1. The control circuit CU (region 30) is formed between the input switch SW1 (region 10) and the output switch SW2 (region 20), so that it can suppress electromagnetic coupling between the input switch SW1 (region 10) and the output switch SW2 (region 20), thereby making it possible to secure a sufficient level of isolation therebetween. As a result, unwanted oscillation of the power amplifier module M1 can be reduced. The IC chip C2 is disposed between the input matching circuit MN1 and the inter-stage matching circuit MN2 (region 40) and the output matching circuit MN3 (region 50), thereby making it possible to secure a sufficient level of isolation therebetween. Additionally, the input switch SW1 (region 10), the input matching circuit MN1 (region 40), and the inter-stage matching circuit MN2 (region 40) are disposed on the same side of the power amplifier module M1. The output switch SW2 (region 20) and the output matching circuit MN3 (region 50) are disposed on the same side of the power amplifier module M1, thereby enhancing the isolation effect. The ground surface G1 is formed between the input switch SW1 (region 10) and the output switch SW2 (region 20) on the back surface of the IC chip C1, while the ground surface G2 is formed on the back surface of the IC chip C2, thereby enhancing the isolation effect. The ground layer G3 connected to the ground surfaces G1 and G2 can be formed so as to be interposed between the components of the power amplifier module M1, in particular, between the input matching circuit MN1 and the inter-stage matching circuit MN2 (region 40) and the output matching circuit MN3 (region 50), as viewed from a direction substantially perpendicular to the mounting surface of the substrate 100. This configuration can further enhance the isolation effect. A signal path for allowing an RF signal to pass therethrough is indicated by the long dashed dotted lines SL1 in FIG. 3. In contrast to the configuration of the related art in which the individual components forming the power amplifier module M1 are discretely disposed, it is possible to minimize the length of the signal path SL1 in the power amplifier module M1 according to the first embodiment, thereby reducing the insertion loss.

Figure 4:
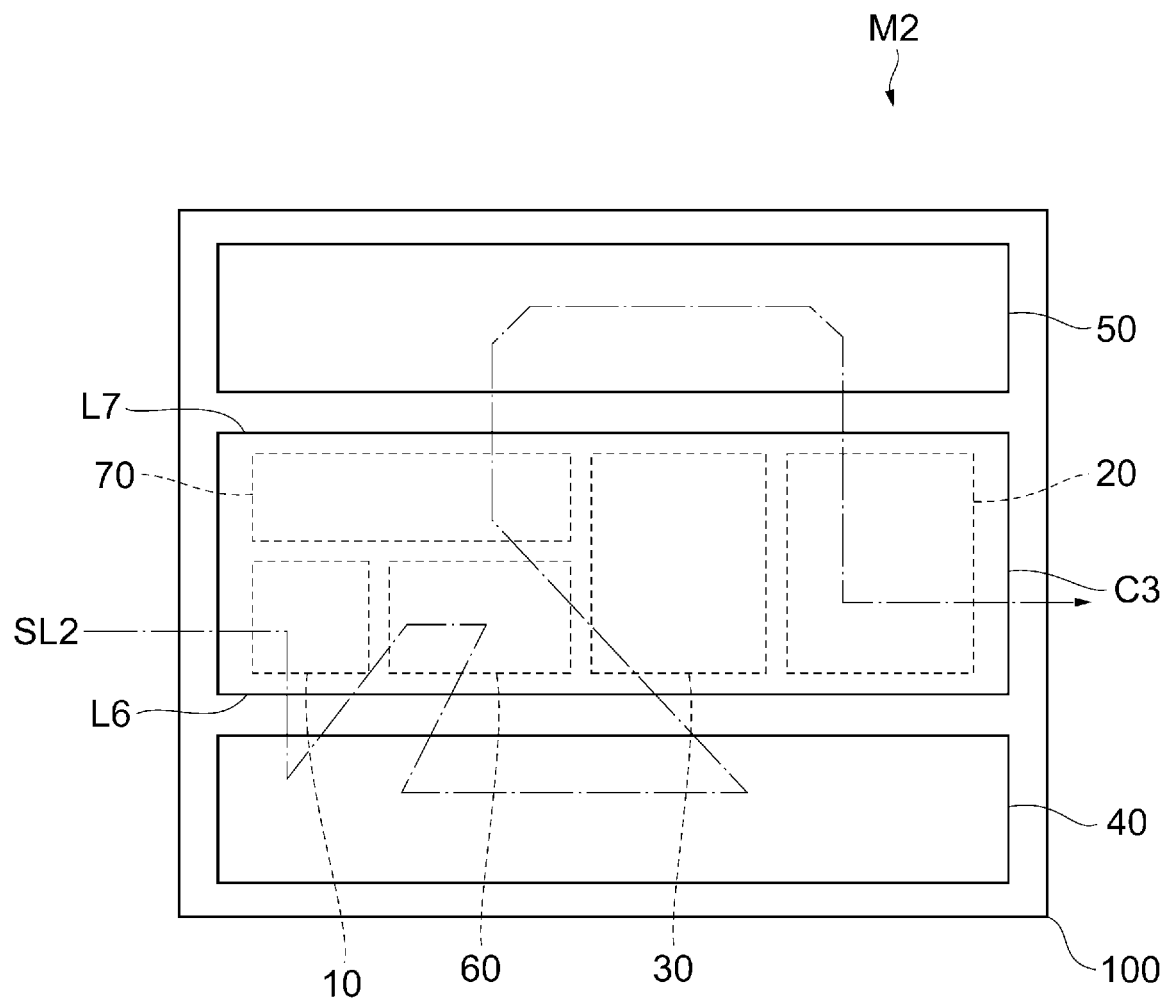
FIG. 4 illustrates the layout of individual components forming a power amplifier module according to a second embodiment.

FIG. 4 illustrates the layout of individual components forming a power amplifier module M2 according to a second embodiment. The power amplifier module M2 is different from the power amplifier module M1 of the first embodiment in that it includes an IC chip C3 instead of the IC chips C1 and C2. The relationships concerning the connecting state among the components of the power amplifier module M2 is the same as those of the first embodiment shown in FIG. 1.

In FIG. 4, the driver-stage amplifier PA1 is disposed in a region 60, and the output-stage amplifier PA2 is disposed in a region 70. The input switch SW1 (region 10), the output switch SW2 (region 20), the control circuit CU (region 30), the driver-stage amplifier PA1 (region 60), and the output-stage amplifier PA2 (region 70) are integrated into the single IC chip C3. The IC chip C3 is flip-chip mounted on the substrate 100 and is disposed between the input matching circuit MN1 and the inter-stage matching circuit MN2 (region 40) and the output matching circuit MN3 (region 50). For the sake of representation, the wiring for connecting each of the IC chip C3, the input matching circuit MN1, the inter-stage matching circuit MN2, and the output matching circuit MN3 is not shown.

The control circuit CU (region 30) is disposed between the input switch SW1 (region 10) and the output switch SW2 (region 20). The driver-stage amplifier PA1 (region 60) and/or the output-stage amplifier PA2 (region 70) are disposed between the input switch SW1 (region 10) and the control circuit CU (region 30). The control circuit CU (region 30) is disposed between the output switch SW2 (region 20) and a set of the input switch SW1 (region 10), the driver-stage amplifier PA1 (region 60), and the output-stage amplifier PA2 (region 70). Among the four sides of the IC chip C3, the side positioned most closely to the input switch SW1 (region 10) and the driver-stage amplifier PA1 (region 60) will be called a side L6, and the side positioned most closely to the output-stage amplifier PA2 (region 70) will be called a side L7. The sides L6 and L7 oppose each other.

Figure 5:
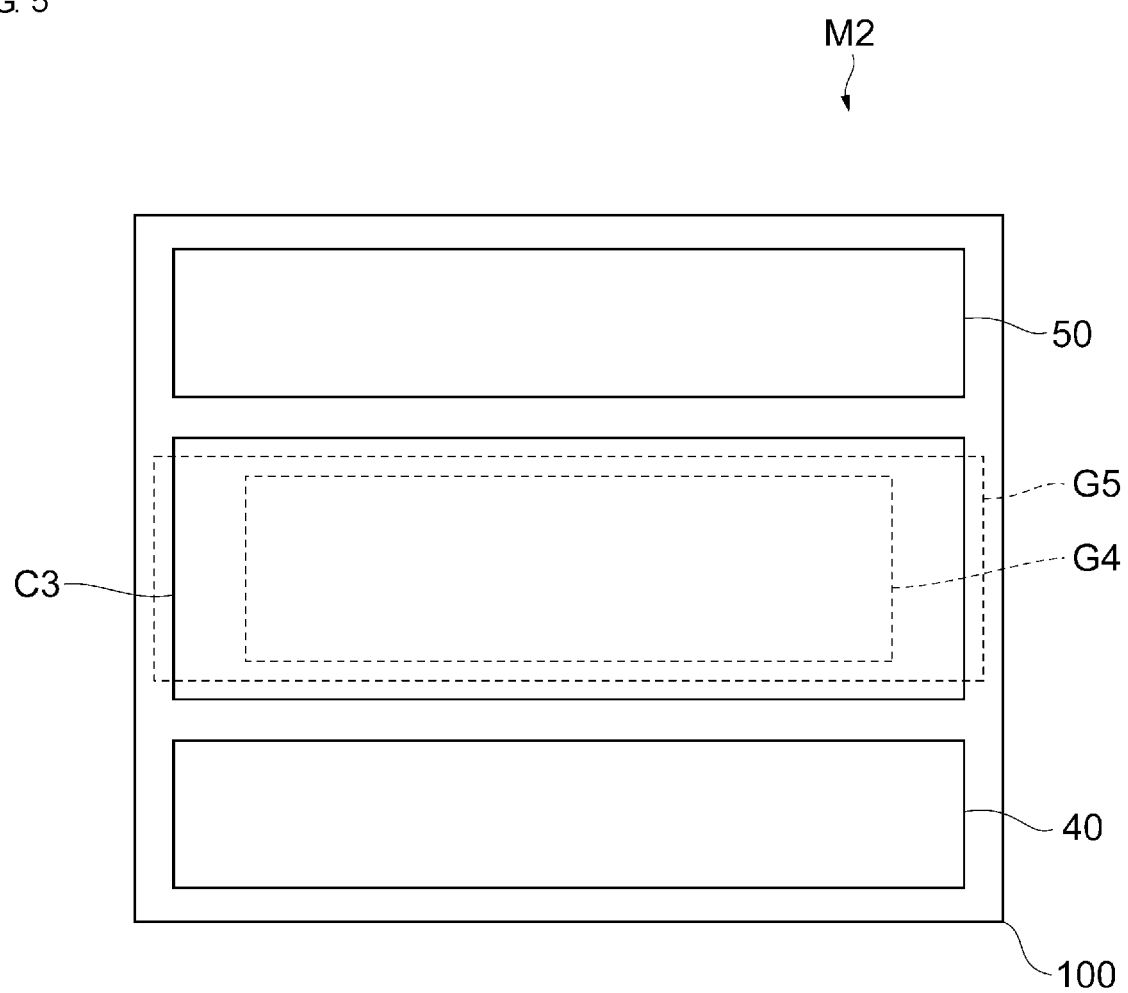
FIG. 5 illustrates the positional relationship of a ground surface and a ground layer to the other components of the power amplifier module according to the second embodiment.

FIG. 5 illustrates the positional relationship of a ground surface and a ground layer to the other components of the power amplifier module M2. A ground surface G4 is formed on one of the two main surfaces of the IC chip C3. More specifically, the ground surface G4 is formed on the main surface (back surface, for example) of the IC chip 3 which is in contact with the substrate 100. A ground layer G5 is buried in the substrate 100. The ground surface G4 and the ground layer G5 are electrically connected to each other through a via-hole (not shown).

In the power amplifier module M2 according to the second embodiment, the input switch SW1 (region 10), the output switch SW2 (region 20), the control circuit CU (region 30), the driver-stage amplifier PA1 (region 60), and the output-stage amplifier PA2 (region 70) are integrated into the single IC chip C3, thereby eliminating the need to connect these components by using wires or wiring provided on the substrate 100. Hence, fewer components can be mounted on the substrate 100, thereby reducing the size and the cost of the power amplifier module M2. In the second embodiment, even fewer components can be mounted on the substrate 100 than those in the first embodiment, thereby making it easier to flip-chip mount the IC chip C3 on the substrate 100 than the IC chips C1 and C2 on the substrate 100. The ground surface G4 is formed on the back surface of the IC chip C3, thereby making it possible to secure a sufficient level of isolation between input and output signals. The ground layer G5 connected to the ground surface G4 can be formed so as to be interposed between the components of the power amplifier module M2, in particular, between the input matching circuit MN1 and the inter-stage matching circuit MN2 (region 40) and the output matching circuit MN3 (region 50), as viewed from a direction substantially perpendicular to the mounting surface of the substrate 100. This configuration can further enhance the isolation effect. A signal path for allowing an RF signal to pass therethrough is indicated by the long dashed dotted lines SL2 in FIG. 4. In contrast to the configuration of the related art in which the individual components forming the power amplifier module M2 are discretely disposed, it is possible to minimize the length of the signal path SL2 in the power amplifier module M2 according to the second embodiment, thereby reducing the insertion loss.

Figure 6:
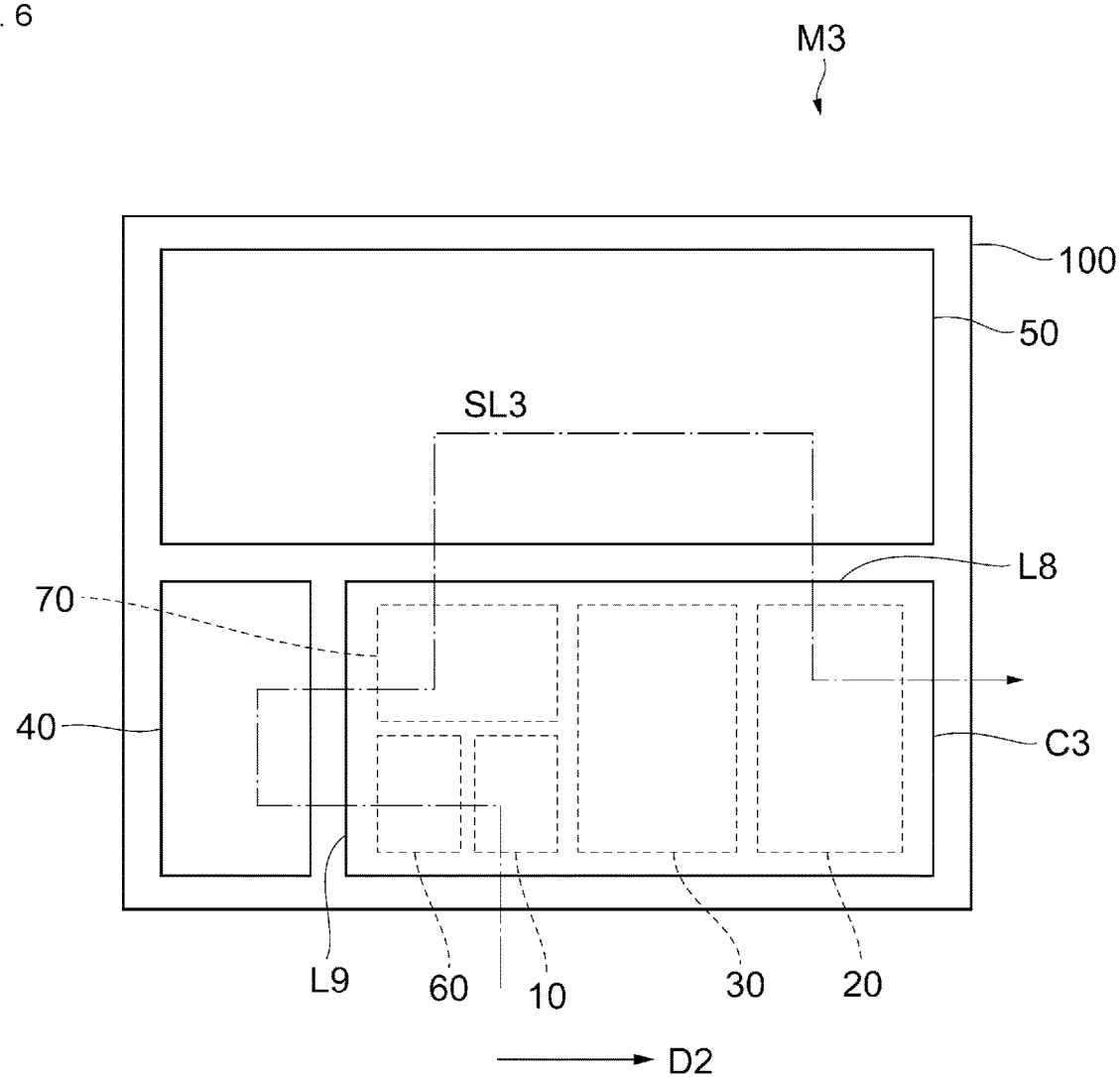
FIG. 6 illustrates the layout of individual components forming a power amplifier module according to a third embodiment.

FIG. 6 illustrates the layout of individual components forming a power amplifier module M3 according to a third embodiment. The power amplifier module M3 is different from the power amplifier module M2 of the second embodiment in the relative positional relationships between the regions 10 and 60 and between the regions 40 and 50. The relationships concerning the connecting state among the components of the power amplifier module M3 is the same as those of the first embodiment shown in FIG. 1. In the third embodiment, as well as in the second embodiment, a ground surface G4 is formed on the IC chip C3, and a ground layer G5 is buried in the substrate 100. The ground surface G4 and the ground layer G5 are electrically connected to each other through a via-hole (not shown). For the sake of representation, the wiring for connecting each of the IC chip C3, the input matching circuit MN1 (region 40), the inter-stage matching circuit MN2 (region 40), and the output matching circuit MN3 (region 50) is not shown. The power amplifier module M3 will be described below mainly by referring to the points different from the power amplifier module M2 of the second embodiment, and a detailed explanation of the same points will be omitted.

The input switch SW1 (region 10) is disposed between the controller CU (region 30) and the driver-stage amplifier PA1 (region 60) and/or the output-stage amplifier PA2 (region 70). For the sake of description, the direction in which the driver-stage amplifier PA1 (region 60), the input switch SW1 (region 10), the control circuit CU (region 30), and the output switch SW2 (region 20) are arranged will be called an arrangement direction D2. Among the four sides of the IC chip C3, the side substantially parallel with the arrangement direction D2 and positioned most closely to the output-stage amplifier PA2 will be called a side L8. Among the four sides of the IC chip C3, the side substantially orthogonal to the side L8 and positioned most closely to the driver-stage amplifier PA1 (region 60) will be called a side L9. In this case, the output matching circuit MN3 (region 50) is disposed substantially parallel with the side L8 and is positioned most closely to the side L8 among the four sides of the IC chip C3. The input matching circuit MN1 and the inter-stage matching circuit MN2 (region 40) are disposed substantially parallel with the side L9 and are positioned most closely to the side L9 among the four sides of the IC chip C3.

In the power amplifier module M3 according to the third embodiment, the wiring for input signals and that for output signals can be formed in two directions substantially orthogonal to each other, thereby securing a sufficient level of isolation between input and output signals. A signal path for allowing an RF signal to pass therethrough is indicated by the long dashed dotted lines SL3 in FIG. 6. In contrast to the configuration of the related art in which the individual components forming the power amplifier module M3 are discretely disposed, it is possible to minimize the length of the signal path SL3 in the power amplifier module M3 according to the third embodiment, thereby reducing the insertion loss.

Figure 7:
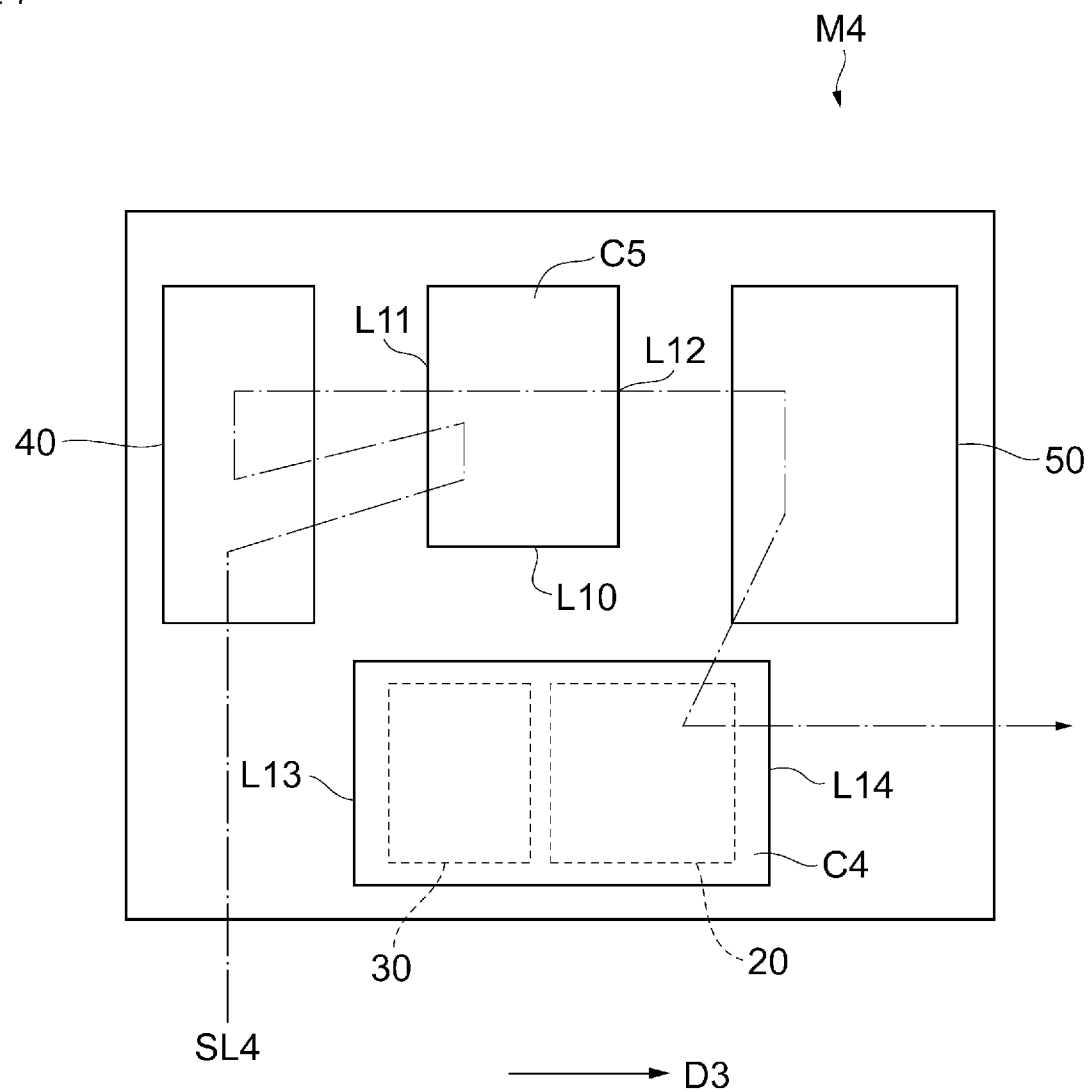
FIG. 7 illustrates the layout of individual components forming a power amplifier module according to a fourth embodiment.

FIG. 7 illustrates the layout of individual components forming a power amplifier module M4 according to a fourth embodiment. The power amplifier module M4 is different from the power amplifier module M1 of the first embodiment in that it does not include the input switch SW1. The relationships concerning the connecting state among the components of the power amplifier module M4 is the same as those of the first embodiment shown in FIG. 1. The power amplifier module M4 will be described below mainly by referring to the points different from the power amplifier module M1 of the first embodiment, and a detailed explanation of the same points will be omitted.

The output switch SW2 (region 20) and the control circuit CU (region 30) are integrated into a single IC chip C4. The driver-stage amplifier PA1 and the output-stage amplifier PA2 are integrated into a single IC chip C5. For the sake of representation, the wiring for connecting each of the IC chips C4 and C5, the input matching circuit MN1 (region 40), the inter-stage matching circuit MN2 (region 40), and the output matching circuit MN3 (region 50) is not shown. For the sake of description, the direction in which the control circuit CU (region 30) and the output switch SW2 (region 20) are arranged will be called an arrangement direction D3. Among the four sides of the IC chip C5, the side substantially parallel with the arrangement direction D3 and positioned most closely to the IC chip C4 will be called a side L10. Among the four sides of the IC chip C5, the side positioned most closely to the input matching circuit MN1 (region 40) and the inter-stage matching circuit MN2 (region 40) will be called a side L11. Among the four sides of the IC chip C5, the side positioned most closely to the output matching circuit MN3 (region 50) will be called a side L12. The sides L11 and L12 oppose each other with the side L10 interposed therebetween. Among the four sides of the IC chip C4, the side substantially perpendicular to the arrangement direction D3 and positioned most closely to the control circuit CU (region 30) will be called a side L13. Among the four sides of the IC chip C4, the side substantially perpendicular to the arrangement direction D3 and positioned most closely to the output switch SW2 (region 20) will be called a side L14. The sides L11 and L13 are disposed on the same side of the power amplifier module M4 (the left side in FIG. 7). The sides L12 and L14 are disposed on the same side of the power amplifier module M4 (the right side in FIG. 7).

In the power amplifier module M4 according to the fourth embodiment, the output switch SW2 (region 20) and the control circuit CU (region 30) are integrated into the single IC chip C4, thereby eliminating the need to connect these components by using wires or wiring provided on the substrate 100. Hence, fewer components can be mounted on the substrate 100, thereby reducing the size and the cost of the power amplifier module M4. The IC chip C5 is disposed between the input matching circuit MN1 and the inter-stage matching circuit MN2 (region 40) and the output matching circuit MN3 (region 50), thereby securing a sufficient level of isolation therebetween. Additionally, the input matching circuit MN1 (region 40) and the inter-stage matching circuit MN2 (region 40) are disposed on the same side of the power amplifier module M4, while the output switch SW2 (region 20) and the output matching circuit MN3 (region 50) are disposed on the same side of the power amplifier module M4, thereby securing a sufficient level of isolation between input and output signals. A signal path for allowing an RF signal to pass therethrough is indicated by the long dashed dotted lines SL4 in FIG. 7. In contrast to the configuration of the related art in which the individual components forming the power amplifier module M4 are discretely disposed, it is possible to minimize the length of the signal path SL4 in the power amplifier module M4 according to the fourth embodiment, thereby reducing the insertion loss.

Figure 8:
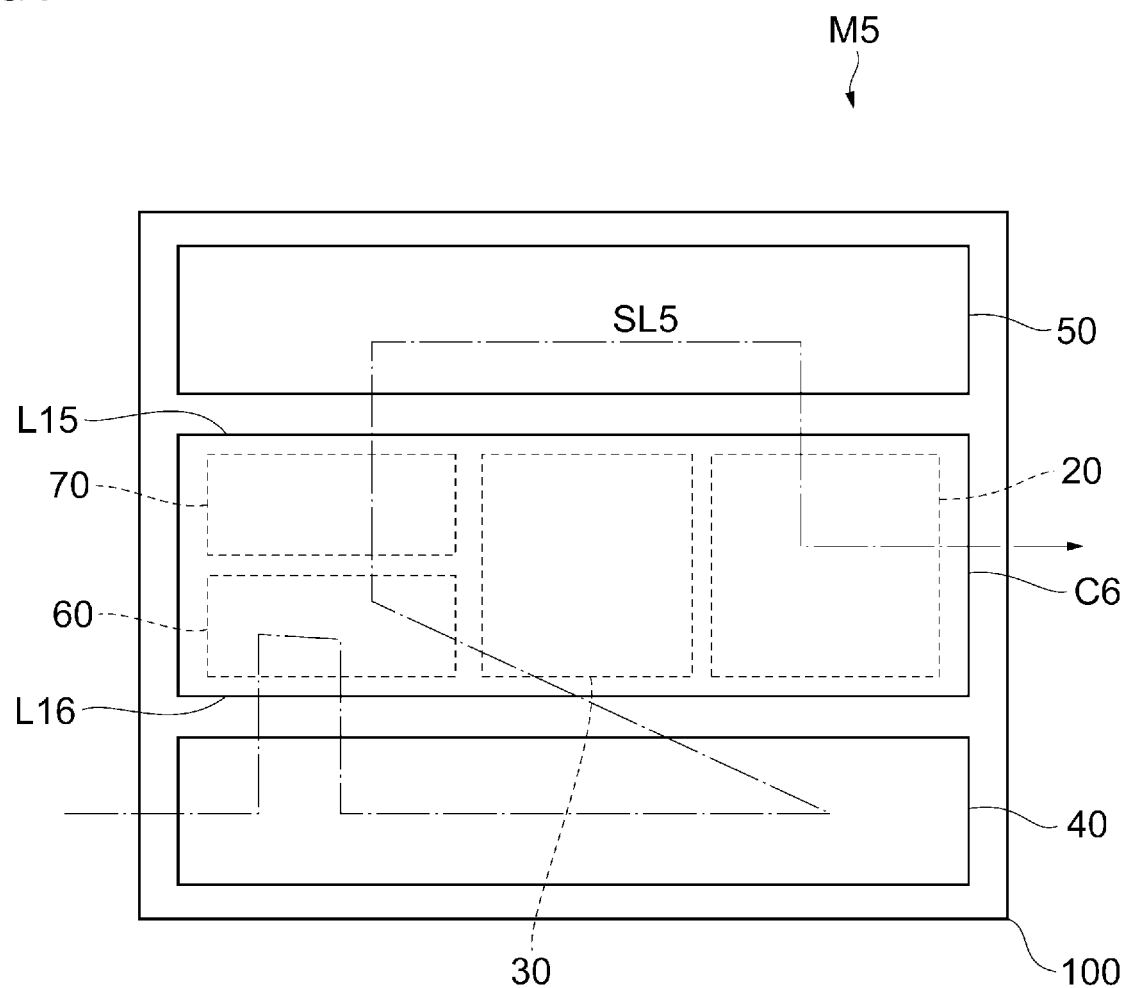
FIG. 8 illustrates the layout of individual components forming a power amplifier module according to a fifth embodiment.

FIG. 8 illustrates the layout of individual components forming a power amplifier module M5 according to a fifth embodiment. The power amplifier module M5 is different from the power amplifier module M4 of the fourth embodiment in that it includes an IC chip C6 instead of the IC chips C4 and C5 included in the power amplifier module M4. The relationships concerning the connecting state among the components of the power amplifier module M5 is the same as those of the first embodiment shown in FIG. 1.

The driver-stage amplifier PA1 (region 60), the output-stage amplifier PA2 (region 70), the control circuit CU (region 30), and the output switch SW2 (region 20) are integrated into a single IC chip C6. For the sake of representation, the wiring for connecting each of the IC chip C6, the input matching circuit MN1 (region 40), the inter-stage matching circuit MN2 (region 40), and the output matching circuit MN3 (region 50) is not shown. The IC chip C6 is flip-chip-mounted on the substrate 100. The control circuit CU (region 30) is disposed between the output switch SW2 (region 20) and a set of the driver-stage amplifier PA1 (region 60) and the output-stage amplifier PA2 (region 70). Among the four sides of the IC chip C6, the side positioned most closely to the output-stage amplifier PA2 (region 70) and the output matching circuit MN3 (region 50) will be called a side L15. Among the four sides of the IC chip C6, the side positioned most closely to the driver-stage amplifier PA1 (region 60), the input matching circuit MN1 (region 40), and the inter-stage matching circuit MN2 (region 40) will be called a side L16. The sides L15 and L16 oppose each other.

In the power amplifier module M5 according to the fifth embodiment, the output switch SW2 (region 20), the control circuit CU (region 30), the driver-stage amplifier PA1 (region 60), and the output-stage amplifier PA2 (region 70) are integrated into the single IC chip C6, thereby eliminating the need to connect these components by using wires or wiring provided on the substrate 100. Hence, fewer components can be mounted on the substrate 100, thereby reducing the size and the cost of the power amplifier module M5. In the fifth embodiment, even fewer components can be mounted on the substrate 100 than those in the fourth embodiment, thereby making it easier to flip-chip mount the IC chip C6 on the substrate 100 than the IC chips C4 and C5 on the substrate 100. The IC chip C6 is disposed between the input matching circuit MN1 and the inter-stage matching circuit MN2 (region 40) and the output matching circuit MN3 (region 50), thereby securing a sufficient level of isolation between input and output signals. A signal path for allowing an RF signal to pass therethrough is indicated by the long dashed dotted lines SL5 in FIG. 8. In contrast to the configuration of the related art in which the individual components forming the power amplifier module M5 are discretely disposed, it is possible to minimize the length of the signal path SL5 in the power amplifier module M5 according to the fifth embodiment, thereby reducing the insertion loss.

Figure 9:
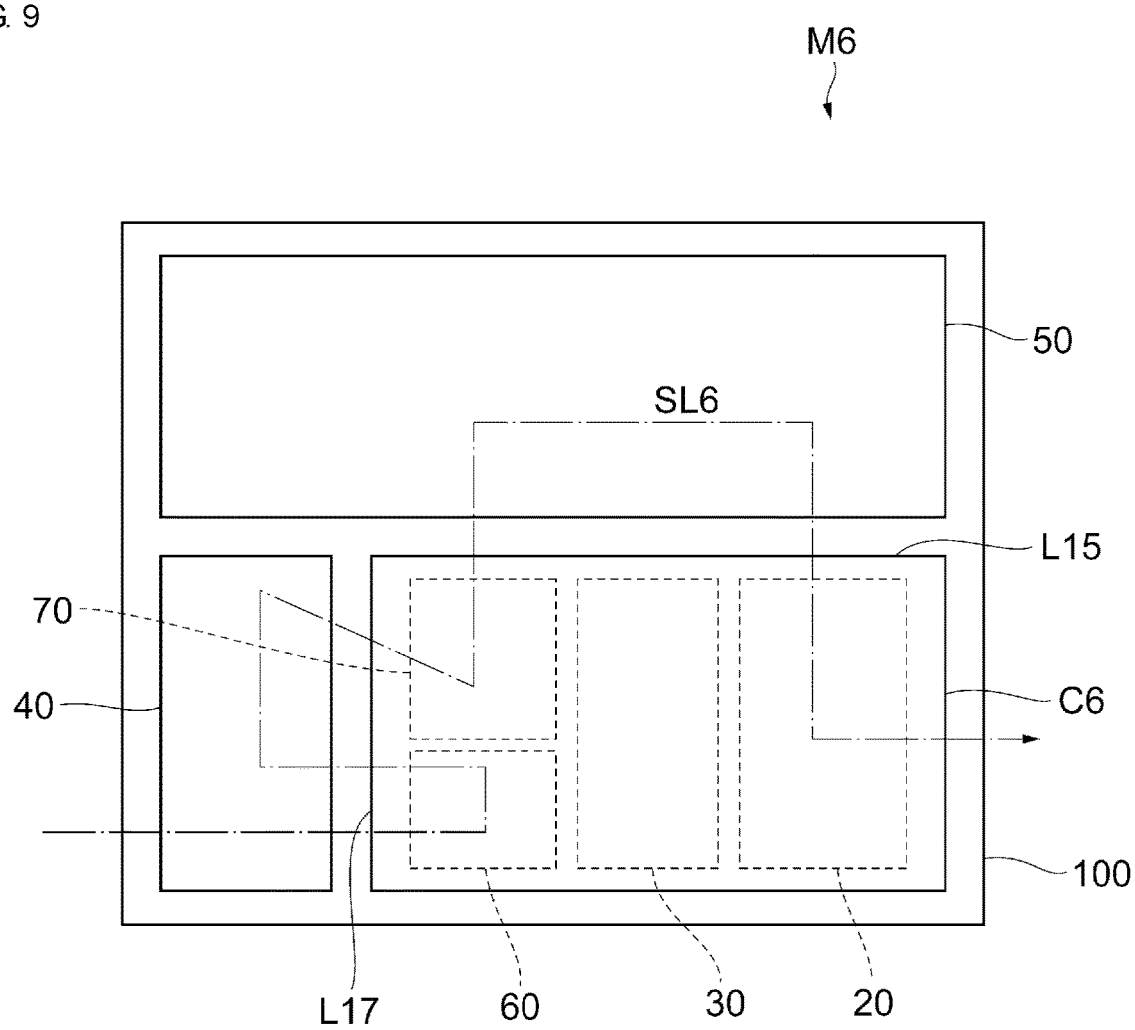
FIG. 9 illustrates the layout of individual components forming a power amplifier module according to a sixth embodiment.

FIG. 9 illustrates the layout of individual components forming a power amplifier module M6 according to a sixth embodiment. The power amplifier module M6 is different from the power amplifier module M5 of the fifth embodiment in the relative positional relationship between the regions 40 and 50. The relationships concerning the connecting state among the components of the power amplifier module M6 is the same as those of the first embodiment shown in FIG. 1. Among the four sides of the IC chip C6, the side positioned most closely to the driver-stage amplifier PA1 (region 60), the input matching circuit MN1 (region 40), and the inter-stage matching circuit MN2 (region 40) will be called a side L17. The sides L15 and L17 are substantially orthogonal to each other.

In the power amplifier module M6 according to the sixth embodiment, the wiring for input signals and that for output signals can be formed in two directions substantially orthogonal to each other, thereby securing a sufficient level of isolation between input and output signals. A signal path for allowing an RF signal to pass therethrough is indicated by the long dashed dotted lines SL6 in FIG. 9. In contrast to the configuration of the related art in which the individual components forming the power amplifier module M6 are discretely disposed, it is possible to minimize the length of the signal path SL6 in the power amplifier module M6 according to the sixth embodiment, thereby reducing the insertion loss.

Figure 10:
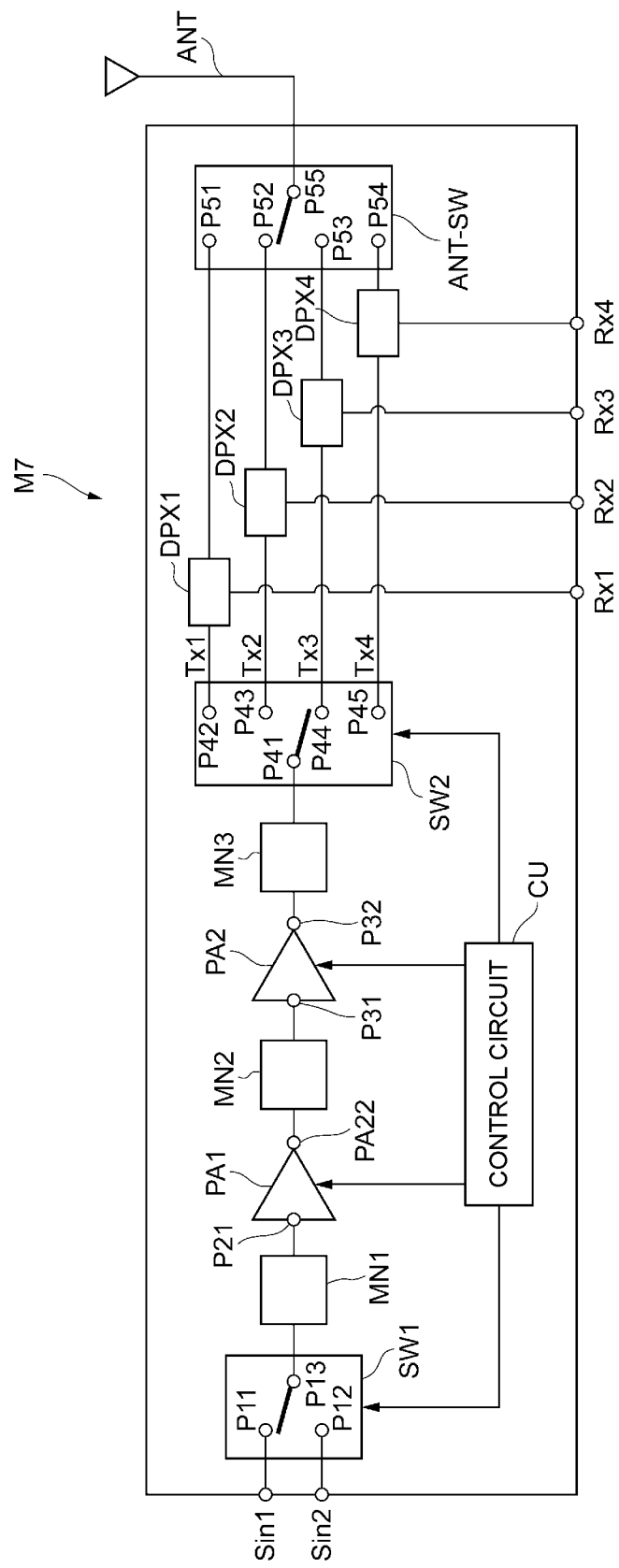
FIG. 10 illustrates the configuration of a power amplifier module according to a seventh embodiment.

FIG. 10 illustrates the configuration of a power amplifier module M7 according to a seventh embodiment. The power amplifier module M7 is different from the power amplifier module M1 of the first embodiment in that it includes plural duplexers DPX1, DPX2, DPX3, and DPX4 and an antenna switch ANT-SW. The antenna switch ANT-SW includes terminals P51, P52, P53, and P54 connected to the duplexers DPX1, DPX2, DPX3, and DPX4, respectively, and also includes an antenna terminal P55 connected to an antenna ANT. The antenna switch ANT-SW selectively establishes a signal path between one of the plural terminals P51, P52, P53, and P54 and the antenna terminal P55 so as to selectively connect one of the plural output signal paths Tx1, Tx2, Tx3, and Tx4 to the antenna terminal P55. The control circuit CU controls the switching operation of the antenna switch ANT-SW.

The duplexer DPX1 separates an RF signal (transmit signal) input into the duplexer DPX1 via the output signal path Tx1 and an RF signal (received signal) input from the terminal P51 of the antenna switch ANT-SW to the duplexer DPX1. Likewise, the duplexers DPX2, DPX3, and DPX4 separate transmit signals and received signals from each other. The received signals subjected to filtering performed by the duplexers DPX1, DPX2, DPX3, and DPX4 pass through received signal paths Rx1, Rx2, Rx3, and Rx4, respectively.

Figure 11:
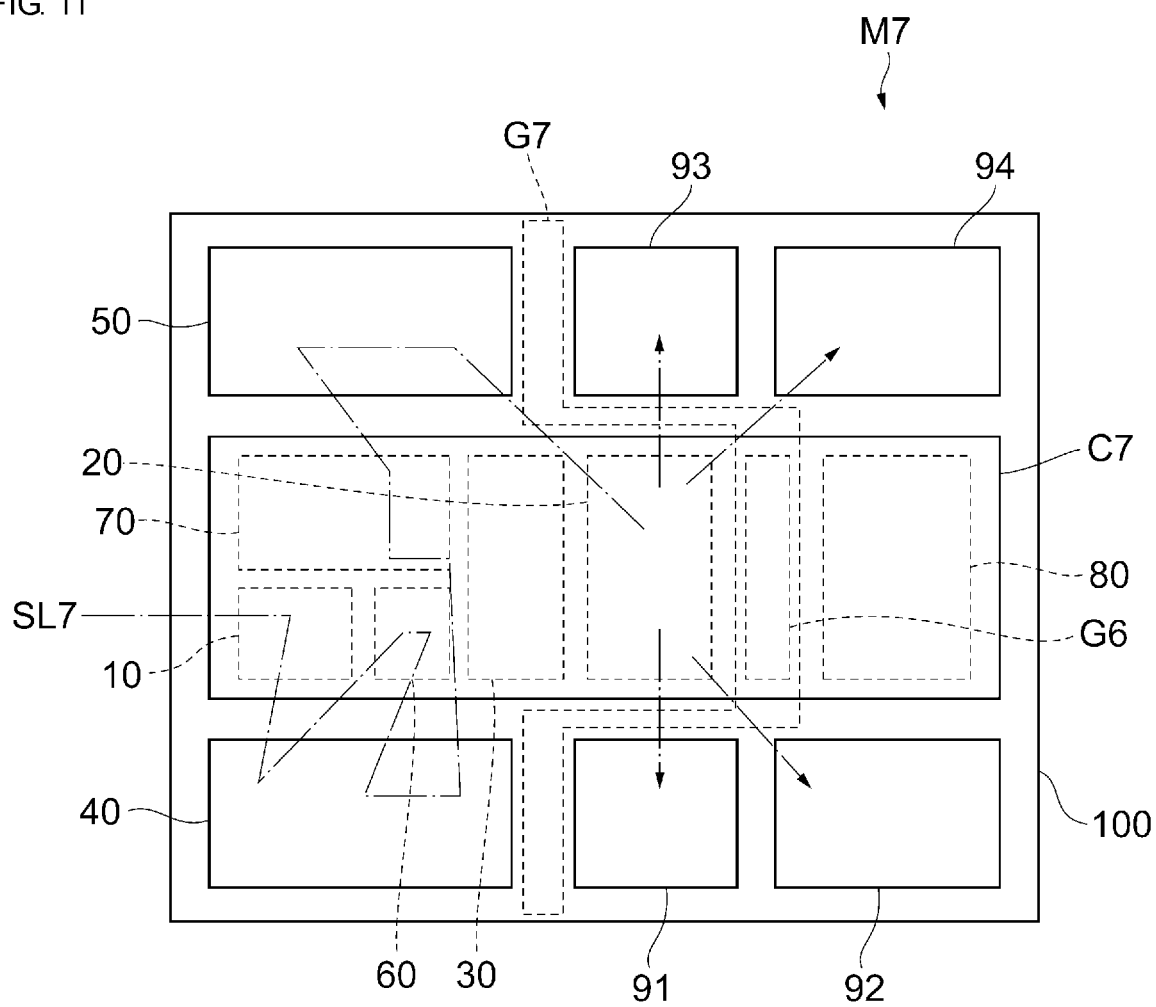
FIG. 11 illustrates the layout of individual components forming the power amplifier module according to the seventh embodiment.

FIG. 11 illustrates the layout of individual components forming the power amplifier module M7 according to the seventh embodiment. The antenna switch ANT-SW is disposed in a region 80. The duplexers DPX1, DPX2, DPX3, and DPX4 are disposed in regions 91, 92, 93, and 94, respectively. The driver-stage amplifier PA1 (region 60), the output-stage amplifier PA2 (region 70), the input switch SW1 (region 10), the output switch SW2 (region 20), the control circuit CU (region 30), and the antenna switch ANT-SW (region 80) are integrated into a single IC chip C7. For the sake of representation, the wiring for connecting each of the IC chip C7, the duplexer DPX1 (region 91), the duplexer DPX2 (region 92), the duplexer DPX3 (region 93), the duplexer DPX4 (region 94), the input matching circuit MN1 (region 40), the inter-stage matching circuit MN2 (region 40), and the output matching circuit MN3 (region 50) is not shown. The IC chip C7 is flip-chip-mounted on the substrate 100. The IC chip C7 is disposed between a set of the duplexer DPX1 (region 91) and the duplexer DPX2 (region 92) and a set of the duplexer DPX3 (region 93) and the duplexer DPX4 (region 94). The control circuit CU (region 30) is disposed between the input switch SW1 (region 10) and the output switch SW2 (region 20). A ground surface G6 is formed between the output switch SW2 (region 20) and the antenna switch ANT-SW (region 80) on one of the two main surfaces of the IC chip C7. More specifically, the ground surface G6 is formed on the main surface (back surface, for example) of the IC chip C7 which is in contact with the substrate 100. A ground layer G7 is buried in the substrate 100. The ground surface G6 and the ground layer G7 are electrically connected to each other through a via-hole (not shown). The relative positional relationships among the input switch SW1 (region 10), the output switch SW2 (region 20), the control circuit CU (region 30), the driver-stage amplifier PA1 (region 60), and the output-stage amplifier PA2 (region 70) is substantially the same as that in the third embodiment, and a detailed explanation thereof will thus be omitted.

In the power amplifier module M7 according to the seventh embodiment, the driver-stage amplifier PA1 (region 60), the output-stage amplifier PA2 (region 70), the input switch SW1 (region 10), the output switch SW2 (region 20), the control circuit CU (region 30), and the antenna switch ANT-SW (region 80) are integrated into the single IC chip C7, thereby eliminating the need to connect these components by using wires or wiring provided on the substrate 100. Hence, fewer components can be mounted on the substrate 100, thereby reducing the size and the cost of the power amplifier module M7. The control circuit CU (region 30) is formed between the input switch SW1 (region 10) and the output switch SW2 (region 20), so that it can suppress electromagnetic coupling between the input switch SW1 (region 10) and the output switch SW2 (region 20), thereby securing a sufficient level of isolation therebetween. As a result, unwanted oscillation of the power amplifier module M7 can be reduced. The ground surface G6 is formed between the output switch SW2 (region 20) and the antenna switch ANT-SW (region 80), thereby enhancing isolation therebetween. The ground surface G6 formed on the back surface of the IC chip C7 is connected to the ground layer G7 formed in the substrate 100, thereby securing a sufficient level of isolation between the output switch SW2 (region 20) and the antenna switch ANT-SW (region 80). The ground layer G7 connected to the ground surface G6 can be formed so as to be interposed between the components of the power amplifier module M7, in particular, between the region 40 and the regions 91 and 92 and between the region 50 and the regions 93 and 94, as viewed from a direction substantially perpendicular to the mounting surface of the substrate 100. This configuration can further enhance the isolation effect. A signal path for allowing an RF signal to pass therethrough is indicated by the long dashed dotted lines SL7 in FIG. 11. In contrast to the configuration of the related art in which the individual components forming the power amplifier module M7 are discretely disposed, it is possible to minimize the length of the signal path SL7 in the power amplifier module M7 according to the seventh embodiment, thereby reducing the insertion loss.

To distinguish the IC chips C1 through C7 from each other, the IC chip C1 may be called the i-th IC chip (i is an integer of 1 to 7). To distinguish the sides L1 through L17 from each other, the side j may be called the j-th side (j is an integer of 1 to 17). To distinguish the ground surfaces G1 and G2 from each other, the ground surface G1 may be called a first ground surface, and the ground surface G2 may be called a second ground surface.

The above-described embodiments are provided for facilitating the understanding of the disclosure, but are not intended to be exhaustive or to limit the disclosure to the precise forms disclosed. Modifications and/or improvements may be made without necessarily departing from the spirit and scope of the disclosure, and equivalents of the disclosure are also encompassed in the disclosure. That is, suitable design changes made to the embodiments by those skilled in the art are also encompassed in the disclosure within the spirit and scope of the disclosure. For example, the elements and the positions thereof of the embodiments are not restricted to those described in the embodiments and may be changed in an appropriate manner.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A power amplifier module comprising:
an output-stage amplifier;
a driver-stage amplifier that is connected to an input of the output-stage amplifier;
an input switch configured to selectively connect one of a plurality of input signal paths to an input of the driver-stage amplifier;
an output switch configured to selectively connect one of a plurality of output signal paths to an output of the output-stage amplifier; and
a control circuit configured to control the input switch, the output switch, an antenna switch, the driver-stage amplifier, and the output-stage amplifier, wherein:
the output switch, and the control circuit are integrated into a first integrated circuit (IC) chip, and
within the first IC chip, the control circuit is physically arranged adjacent to the output switch.
2. The power amplifier module according to claim 1, wherein:
the driver-stage amplifier and the output-stage amplifier are integrated into a second IC chip according to an arrangement direction,
the control circuit and the output switch are arranged according to the arrangement direction.
3. The power amplifier module according to claim 1, further comprising:
a substrate for mounting the first IC chip, wherein a first ground surface is formed on a main surface of the first IC chip that is in contact with the substrate.
4. The power amplifier module according to claim 1, wherein:
the driver-stage amplifier and the output-stage amplifier are integrated into a second IC chip,
the power amplifier module further comprises a substrate for mounting the first IC chip and the second IC chip,
a first ground surface is formed on a main surface of the first IC chip that is in contact with the substrate,
a second ground surface is formed on a main surface of the second IC chip that is in contact with the substrate, and
the first ground surface and the second ground surface are connected to each other.
5. A power amplifier module comprising:
an output-stage amplifier;
a driver-stage amplifier that is connected to an input of the output-stage amplifier;
an input switch configured to selectively connect one of a plurality of input signal paths to an input of the driver-stage amplifier;
an output switch configured to selectively connect one of a plurality of output signal paths to an output of the output-stage amplifier; and
a control circuit configured to control the input switch, the output switch, an antenna switch, the driver-stage amplifier, and the output-stage amplifier, wherein:
the input switch, and the control circuit are integrated into a first integrated circuit (IC) chip, and
within the first IC chip, the control circuit is physically arranged adjacent to the input switch.
6. The power amplifier module according to claim 5, wherein:
the driver-stage amplifier and the output-stage amplifier are integrated into a second IC chip according to an arrangement direction, and
the control circuit and the input switch are arranged according to the arrangement direction.
7. The power amplifier module according to claim 5, further comprising:
a substrate for mounting the first IC chip, wherein a first ground surface is formed on a main surface of the first IC chip that is in contact with the substrate.
8. The power amplifier module according to claim 5, wherein:
the driver-stage amplifier and the output-stage amplifier are integrated into a second IC chip,
the power amplifier module further comprises a substrate for mounting the first IC chip and the second IC chip, a first ground surface is formed on a main surface of the first IC chip that is in contact with the substrate, a second ground surface is formed on a main surface of the second IC chip that is in contact with the substrate, and the first ground surface and the second ground surface are connected to each other.

9. An amplifier module comprising:

an amplifier;

an input switch configured to selectively connect an input signal path to an input of the amplifier;

an output switch configured to selectively connect an output signal path to an output of the amplifier; and a control circuit configured to control the input switch, the output switch, and the amplifier, wherein:

the input switch, the output switch, and the control circuit are integrated into a first integrated circuit (IC) chip, and within the first IC chip, the control circuit is physically arranged between the input switch and the output switch.

10. The amplifier module according to claim 9, further comprising:

a substrate for mounting the first IC chip, wherein a first ground surface is formed on a main surface of the first IC chip that is in contact with the substrate.

11. The amplifier module according to claim 9, wherein:

the amplifier is integrated into a second IC chip, the amplifier module further comprises a substrate for mounting the first IC chip and the second IC chip, a first ground surface is formed on a main surface of the first IC chip that is in contact with the substrate, a second ground surface is formed on a main surface of the second IC chip that is in contact with the substrate, and the first ground surface and the second ground surface are connected to each other.

* * * * *